(12) United States Patent
Dewdney et al.

(10) Patent No.: US 7,548,061 B2
(45) Date of Patent: Jun. 16, 2009

(54) METHOD AND MAGNETIC RESONANCE APPARATUS FOR SETTING A SHIM TO HOMOGENIZE A MAGNETIC FIELD IN THE APPARATUS

(75) Inventors: Andrew Dewdney, Neunkirchen am Brand (DE); Franz Schmitt, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 12/037,200

(22) Filed: Feb. 26, 2008

(65) Prior Publication Data
US 2008/0204018 A1 Aug. 28, 2008

(30) Foreign Application Priority Data
Feb. 26, 2007 (DE) .................... 10 2007 009 203

(51) Int. Cl.
*G01V 3/00* (2006.01)
(52) U.S. Cl. ........................ 324/309; 324/319
(58) Field of Classification Search ......... 324/300–322; 600/407–445
See application file for complete search history.

(56) References Cited

U.S. PATENT DOCUMENTS

| | | | | |
|---|---|---|---|---|
| 4,680,551 A | * | 7/1987 | O'Donnell et al. | 324/320 |
| 4,700,136 A | * | 10/1987 | Yamaguchi et al. | 324/309 |
| 4,899,109 A | * | 2/1990 | Tropp et al. | 324/320 |
| 5,345,208 A | * | 9/1994 | Dorri et al. | 335/301 |
| 6,750,650 B2 | * | 6/2004 | Kiefer et al. | 324/309 |
| 6,819,952 B2 | * | 11/2004 | Pfefferbaum et al. | 600/410 |
| 7,199,585 B2 | * | 4/2007 | Kruiskamp et al. | 324/320 |
| 7,358,732 B2 | * | 4/2008 | Van Der Kouwe et al. | 324/309 |
| 7,408,354 B2 | * | 8/2008 | Woo et al. | 324/321 |
| 2007/0090837 A1 | * | 4/2007 | Van Der Kouwe et al. | 324/307 |
| 2007/0210796 A1 | * | 9/2007 | Woo et al. | 324/318 |
| 2007/0252597 A1 | * | 11/2007 | Posse | 324/312 |

FOREIGN PATENT DOCUMENTS

EP 1 705 494 A1 9/2006

* cited by examiner

*Primary Examiner*—Brij B Shrivastav
(74) *Attorney, Agent, or Firm*—Schiff Hardin LLP

(57) ABSTRACT

In a method for determination or adaptation of a shim for homogenization of a magnetic field of a magnetic resonance apparatus, which magnetic field is provided for the generation of magnetic resonance exposures of a specific examination region, an automatic determination, of a computer and/or supported by an operator on an image output unit of the computer, is made of a three-dimensional volume that is relevant for the determination or adaptation of the shim and that is matched to the examination region and/or an examination protocol by selection from an arbitrary morphology set of selectable volumes (which morphology set is not limited to specific shapes) and/or by generation of an arbitrarily three-dimensional volume not limited to specific shapes. The computer then automatically calculates the shim for the determined or selected three-dimensional volume.

19 Claims, 2 Drawing Sheets

METHOD AND MAGNETIC RESONANCE APPARATUS FOR SETTING A SHIM TO HOMOGENIZE A MAGNETIC FIELD IN THE APPARATUS

BACKGROUND OF THE INVENTION

1. Field of the Invention

The present invention concerns a method for determination or adaptation (i.e., setting) of a shim for homogenization of a magnetic field of a magnetic resonance apparatus, the magnetic field being provided for the generation of magnetic resonance exposures of a specific examination region, and an associated magnetic resonance apparatus.

2. Description of the Prior Art

The magnetic field in a magnetic resonance tomography apparatus in all cases initially exhibits disruptions of the homogeneity. The reasons for this are due not only to the manner by which the field is produced but also due environmental conditions arising from the image acquisition or existing in the examination space. Disruptions also may be due to the examination subject.

In order to compensate for such inhomogeneities of the magnetic field, components known as shims are used which are coils or steel pieces and the like that are placed in the magnetic field or in proximity to the magnet in order to influence the generated magnetic field in a desired manner.

A shim iteration is implemented in order to determine an optimal shim for a specific acquisition sequence. As a consequence of this iteration, spherical functions are calculated that specify the suitable shim in the first order, as what are known as gradient offsets, and in the second order, as what are known as "advanced" shims, for an examination or acquisition region in question. The calculated functions thus specify the basis for a compensation of magnetic field inhomogeneities.

In order to select the shim volume (thus the region for which a shim iteration or calculation should be implemented), or to precisely adapt the shim volume for the further course of the examination, for calculation of the shim it has been typical to use a rectangular or cuboid volume that includes the slice exposures or groups of slice exposures that are to be generated. This cuboid is selected as an adaptation shim volume (adjust shim volume).

For experienced operators or users of the relevant software, it is possible to redefine the position or extent of the cuboid adaptation volume, so independence of the position and orientation of the cuboid from the slice groups can be achieved.

Nevertheless, the shim volume (thus the volume on the basis of which the optimal shim is determined for an image exposure to be implemented) has previously been limited to a cuboid three-dimensional or a rectangular region. Difficulties result form this in the case of various image acquisitions, for example in cardiology in which image exposures of the heart must be acquired, whose shape significantly deviates from a cuboid. If a cuboid is now simply placed around the heart in order to determine or to optimally adapt the shim, this means that, for example, regions in which heart tissue is not located (namely surrounding air or other tissue) must be included in the calculation of the spherical functions. The calculation is made more difficult by such transitions.

Similar problems result in the acquisition of other examination regions such as, for example, acquisitions of the liver in which a rectangular shape or a cuboid is likewise only marginally suitable to acquire the essentially ellipsoid shape of the liver. The brain as well as the spinal column also exhibit three-dimensional forms that clearly deviate from a cuboid shape.

A method for determination of design parameters for magnet structures for generation of magnetic fields in predetermined spatial volumes as well as a method for correction of magnetic fields in predetermined spatial volumes, in particular for magnetic resonance apparatuses, are known from EP 1 705 494 A1. The predetermined spatial volumes, in which a static magnetic field should be generated that can be corrected as needed in the framework of shimming exhibit an ellipsoid shape.

SUMMARY OF THE INVENTION

An object of the invention is to provide a method of the aforementioned type that is improved with regard to the above-discussed deficiencies.

This object is achieved in accordance with the invention by a method for determination or adaptation of a shim for homogenization of a magnetic field of a magnetic resonance apparatus, the magnetic field being provided for the generation of magnetic resonance exposures of a specific examination region, including the steps of automatic determination, in a computer and/or supported by an operator on an image output unit of a computer, of a three-dimensional volume that is relevant for the determination or adaptation of the shim and matched to the examination region and/or an examination protocol by selection from an arbitrary morphology set of selectable volumes (which morphology set is not limited to specific shapes) and/or by generation of an arbitrarily three-dimensional volume not limited to specific shapes, and calculation by the computer of the shim for the determined three-dimensional volume.

As used herein, "setting a shim" encompasses both determining a shim and adaptation of a shim in the ways described below.

A suitable three-dimensional volume for the shim adaptation to be conducted, which three-dimensional volume should exhibit an optimally homogeneous magnetic field for the image acquisition following the sequence preparation, is thus initially determined or defined dependent on the examination region or an examination protocol selected by an operator (for example a technical assistant or physician conducting the image data acquisition). This three-dimensional volume can be selected wholly automatically by means of a computer from an arbitrary morphology set of selectable volumes, or can be freely generated. Given a free generation of the volume it is taken into account that this is ultimately likewise limited by the underlying processing or control software that controls the shim adaptation and possibly also the image acquisition. Thus only shapes that this software can process for the later calculation of the shim (either as a first calculation or for adaptation of the shim to remedy latter inaccuracies) can be generated.

In accordance with the invention, the computer can make an automatic selection from an arbitrary morphology set that, for example, is stored on the computer and includes a number of three-dimensional volumes.

For this purpose the computer can access, for example, a databank that contains corresponding associations of examination protocols or examination regions with suitable three-dimensional volumes for the shim determination.

Alternatively or additionally (for example a confirmation of the selection or a refinement of the selection), an operator can participate in the selection of the volume through a presentation or a menu of input possibilities on an image output unit. The operator or the computer can arbitrarily generate the three-dimensional volumes using suitable algorithms, so in principle any volume is available.

It is a basis of the invention that the volumes to be determined for the determination or adaptation of the shim are not limited from specific shapes (thus, for example, it does not have to be a cuboid) but rather can be freely drawn or calculated or can be selected from a larger morphology set of different volumes.

After a successful determination of the two-dimensional volume that appears suitable for the shim calculation, by the computer, the calculation of the shim for this volume is implemented. The volume can thus be determined better and more effectively than has previously been possible since it was determined dependent on the examination region or a selected examination protocol and under consideration of its relevance for the shim adaptation or the determination of the shim. Problems that have occurred with conventional shim adaptation methods, due to shim volumes encompassing of regions of air or larger inhomogeneities in the tissue, thus can be avoided.

The inventive method thus enables an image acquisition with the magnetic resonance apparatus that is based on an optimized shim.

The volume for the shim can in principle be freely selected three-dimensionally, but naturally can be a simple cuboid if this appears suitable. In each case the examination region or the examination protocol that an operator has selected for the image acquisition, and possibly the spatial position and the like, are taken into account.

A corresponding system for determination or adaptation of a shim has a computer that is fashioned for automatic or user-aided determination of a three-dimensional volume that is relevant for the determination or adaptation of the shim and matched to the examination region or an examination protocol by selection from an arbitrary morphology set of selectable volumes and/or by generation of an arbitrary three-dimensional volume. The computer of the system is furthermore fashioned for calculation of the shim for the determined three-dimensional volume, According to the invention, a three-dimensional volume can be determined with a formation in the third spatial direction that is independent from the formation in the first two spatial directions. The volume for the shim adaptation in the inventive method thus can be arbitrarily selected in principle. The course extent or conzfiguration in the third spatial direction is not already predetermined by the formation in the other two spatial directions (thus by the selection of a two-dimensional cross-section). For example, no limitation arises due to the fact that, given the selection of a two-dimensional basic shape in the form of a circle, only an extension in the form of a cylindrical shell in the third direction would be possible. Rather, a surface or boundary running in (under the circumstances) an arbitrarily complicated manner can be selected in the third spatial direction, for example such that an ellipsoid results three-dimensionally.

The basis for the selection or generation of the volumes is simply that a calculation of the shim is possible with justifiable effort, and in particular the advantages that arise by no tissue inhomogeneities or larger regions with air must be taken into account in the shim calculation are not lost due to a particularly complicated three-dimensional shape.

The corresponding "task cards" that are provided for the shim adaptation or determination are thus achieved in the sense of the invention by, for example, a three-dimensional sphere or a three-dimensional ellipsoid also being able to be selected or generated.

The three-dimensional volume for the determination or adaptation of the shim can be determined from a library containing a morphology set of predefined volumes (in particular a databank-based library) stored in the computer and/or an external computer connected therewith by data connection, and/or in a separate memory device.

The computer thus can consult, for example, a library to determine a suitable volume after a first image exposure (for example a pre-scan) was processed in an image processing procedure in order, for example, to possibly detect patterns as anatomical shapes, whereupon a comparison with the shapes of the library can be implemented. Smaller libraries can be stored locally at a computer that serves for operation of a single magnetic resonance tomography apparatus. Larger libraries of morphology sets can be provided on external servers or the like. Furthermore, the libraries can be stored on transportable storage media (for example on CD-ROMs) with which an update of the present morphology set can also be effected. Alternatively, an update or a replacement of the morphology set can ensue through Internet access or the like.

Furthermore, the library access by the computer can be initiated or supported by an operator who for this purpose views, for example, a software interface on which the access to the library can be started via a menu, or a specific number of possible volumes of the (in principle arbitrarily embodied) morphology is presented, possibly dependent on a selected examination region. The library access can ensue via an intranet or the Internet, dependent on a password under the circumstances.

The pre-defined volumes are initially not limited with regard to their specific configuration. Rather, the library includes a large number of different volumes, which enables a determination or adaptation of the shim for different examination regions or protocols that is as optimal as possible and requires a small computational effort.

In one embodiment of the invention, a default volume can be predetermined from the library of the morphology set of the predefined volumes dependent on the examination region and/or an examination protocol. For example, in principle an ellipsoid volume can be predetermined for a heart examination. Moreover, it is possible for the default volume to only represent a particular simple shape or a frequently used shape for the respective examination region or the examination protocol, which can then be refined as a result of sub-menus or the like, for example with regard to the dimensions or orientation in space.

The determined, predefined volume, in particular the default volume, can be presented to an operator for interactive adaptation of the parameters defining the volume by the operator on the image output unit. It is thus advantageously graphically enabled for the operator to alter the parameters defining the volume, for example the axis length in an ellipsoid, or the position of the focus, or the position of the center point of a sphere. Other parameters can pertain to the spatial alignment or deviations from the selected basic shape. A position change can also be effected in the interactive adaptation, for example by a suggestion of a volume in a presentation of a first exposure of the examination region or using basic representation of the anatomy of the patient. For example, for a cardio sequence, an elliptical volume (for example in the shape of an American football) in which the three axes and the focus can be graphically interactively altered as user parameters, can be presented to an operator in a three-dimensional overview of the region to be acquired. For this purpose, the operator can use a control tool such as a mouse or input fields, by the axes can be shifted or the volume can be dragged with the mouse, or length specifications in pixels or other measurement units can be made with the aid of input fields.

According to the invention, the pre-defined volume thus can be interactively adapted by the operator in a graphical and/or text-based manner, in particular by clicking with a selection tool and/or a filling and/or change of input fields associated with parameters defining the volume.

The user thus has manifold possibilities to graphically adapt the volume. Naturally, a graphical representation is not absolutely necessary. For experienced operators it may be sufficient when only the parameters defining the volume (thus, for example, the position of a center point of a sphere and its radius) are output in a text field or, if applicable, in a pre-scan or the like. In principle, however, the graphical representation enables a particularly simple and effective selection of the region that is suitable or relevant for the shim adaptation (is known as the "region of interest" for the shim), in particular in an overview scan or the like.

Furthermore, according to the invention anatomical data (in particular data of a body atlas and/or an anatomical library) stored on the computer and/or in an external computer connected with this via a data connection and/or on a separate memory device, can be accessed for determination of anatomically relevant information and/or for determination of a suitable spatial position for a three-dimensional volume, dependent on the examination region and/or on the examination protocol. The access can ensue automatically via the computer, or alternatively or additionally in a user-supported manner. According to the invention different anatomical data can be stored, for example, directly on the computer or on a CD-ROM or a DVD, or externally on a server or the like that are likewise involved in the determination of the shim volume. Such data can advantageously be data from a body atlas or an anatomical library that, among other things, are used for examination planning, for example for determination of the image acquisition volume. This offers the advantage that the anatomical data do not have to be implemented separately for the determination of the shim volume, but rather can already be present and can be incorporated into the shim adaptation via a suitable interface.

The access to an anatomical library or an atlas enables relationships to be established between examination protocols and the underlying anatomical structure (and therewith a suitable shim volume) and the like, for example via suitable databank links. For example, the anatomically relevant dimensions can be used in addition to the basic determination of a suitable shim volume shape (for example as an ellipsoid) by the operator. In this case a first default setting of the different axes of the ellipsoid can be derived from the anatomically relevant dimensions (for example typical dimensions of the liver or the like), for which the computer has a suitable software. Furthermore, using the anatomical atlas or an anatomical library, a first suitable position for a region of interest ellipsoid or another volume can be determined, for example using the selected image acquisition protocol that specifies the acquisition region. After this, the operator then still has the possibility to adapt the provisionally determined spatial position in the framework of a fine-tuning in the event that this is desired or appears necessary. The anatomical library thus provides, for example, the information about the regular position and size of the heart in image exposures, whereupon a first shim volume can be associated therewith.

The three-dimensional volume can furthermore be presented on the image output unit of the computer with anatomical data (in particular dimension data) relevant for the examination region and/or the examination protocol. The three-dimensional volume thus can be shown embedded into the anatomical surroundings to be covered in the frame of the image exposure, for example, for which corresponding images of an anatomical atlas can be used. The atlas images can be magnetic resonance exposures that are considered as particularly typical, or, that have been generated with the same protocol that was selected for the image acquisition to be effected. For a better overview the anatomical data can, for example, be shown dimensioned in that axes of an ellipsoid or a cylinder are dimensioned. In principle the shown anatomical information can be all data that are available or can be referenced from an atlas or a library or, respectively, as supplementary anatomical data, thus also drawings, texts and the like.

A spatial position determined as suitable for a three-dimensional volume can be established dependent on an adaptation by an operator. It is thus possible that a suitable three-dimensional volume shape is initially approximately positioned in a first magnetic resonance exposure or an image of a body atlas, whereupon the operator effects a further adaptation (for example with a mouse click). For example, the operator can enlarge or shrink a sphere by selecting the radius and a specific measurement with the mouse. In general, volumes can be enlarged or reduced or skewed or compressed and the like with suitable control tools such as a keyboard or a computer mouse or the like. If applicable, a fine adaptation can also be effected automatically by software that for this purpose implements additional calculations. These calculations can be based, for example, on image processing programs with pattern or edge recognition and similar algorithms, in which pre-scans or older image exposures of the patient can be processed.

In the framework of the access to the anatomical data, algorithms can be used for image analysis and/or pattern recognition. For example, methods or software functions and routines can be used that enable and provide a suitable or automatic setting, alignment or slice arrangement for the acquisition of the magnetic resonance exposures. Furthermore, segmentation methods for the anatomical data can be used in order to isolate the region that is relevant for an acquired structure. Suitable software-implemented image analysis methods can be directly integrated into the determination of a suitable three-dimensional volume for the shim, thus then no longer serve only for the processing of the anatomical data or matching thereof with image exposures.

In particular an ellipsoid and/or a sphere and/or a cylinder can be provided as three-dimensional volumes in a morphology set. In principle, many different volumes are thus possible and selectable. Furthermore, the use of irregular shapes is possible, for example of volumes that exhibit a cylindrical shape only in principle, but with the cylinder shell having an indentation. Such volumes can likewise already be stored in a morphology set. It is thereby determined (advantageously by the computer) whether the calculation advantages due to the more precise adaptation of the shape are still retained given the selection of complicated three-dimensional volumes.

Furthermore, the invention concerns a magnetic resonance apparatus with a computer (in particular a computer with an image output unit) fashioned for determination or adaptation of a shim for homogenization of a magnetic field provided for the generation of magnetic resonance exposures of a specific examination region, the magnetic resonance apparatus is fashioned for implementation of a method as described above.

The magnetic resonance apparatus or a corresponding system with a computer and associated software is thus fashioned to determine a three-dimensional volume relevant for the determination or adaptation of the shim, which three-dimensional volume is matched to an examination region or an examination protocol that was predetermined by the operator or that exists in the computer. To determine the three-dimensional volume, this can be selected from an arbitrary morphology set of selectable volumes or can in principle be freely or arbitrarily generated. The computer or a storage unit of the system or of the magnetic resonance apparatus is advantageously equipped with a library that contains a suitable morphology set of three-dimensional volumes and/or has access to such a library. The library can embody databank functionalities that enable an association of specific acquisition protocols (that, for example, are stored in the computer) with suitable volumes or the like.

It is also possible for the volume to be drawn or designed with a control tool (such as a mouse) that is coupled with corresponding image processing software. For example, the volume can be drawn in an already-present magnetic resonance exposure of the current region provided for the acquisition.

Furthermore, shapes in a body atlas or other anatomical data can be accessed by means of the computer. An improvement of the shim as well as a faster progression of the workflow before the actual scan is thus enabled via a combination of anatomical data and pre-defined, not necessarily cuboid regions of interest. For example, through the consideration of anatomical data an ellipse shape or ellipsoid shape suitable for cardio acquisitions can be delineated from an ellipse shape for liver acquisitions that exhibits different parameters with regard to the size, the axis ratios and the orientation relative to those for the cardio acquisitions. For imaging in acquisitions of the brain, a further set of ellipsoid parameters can be derived from the anatomical atlas or an anatomical library or can be provided using the atlas or library. A longer, thinner cylinder is particularly suitable for acquisitions of the spinal column. With the inventive apparatus and method and system it is thus possible to provide a predefined, particularly suitable three-dimensional volume or to suitably generate one for the image acquisition for nearly every examination region that can be acquired with magnetic resonance acquisitions (thus for which an acquisition protocol exists or can be defined). The combination with the anatomical data in particular significantly simplifies the work effort since this enables already largely matching volumes to be provided using these data.

DESCRIPTION OF THE PREFERRED EMBODIMENTS

Figure 1:
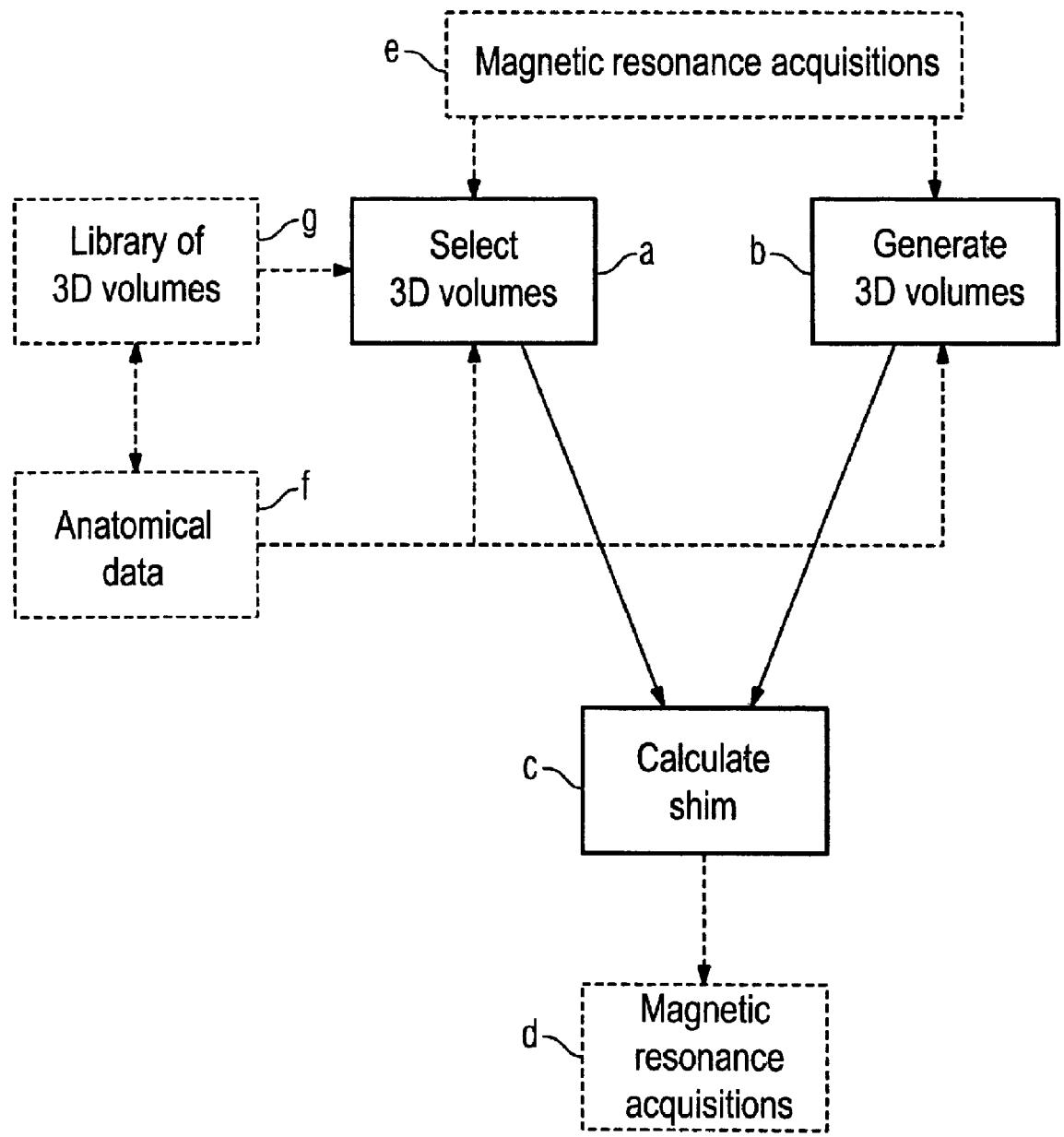
FIG. 1 is a flow chart of an embodiment of the inventive method.

A flow chart of an embodiment of the inventive method is shown in FIG. 1. As is presented in the boxes a and b, 3D volumes suitable for the determination or adaptation of the shim are thereby selected from an arbitrary morphology set of selectable volumes or arbitrarily generated automatically by a computer or by the computer interacting with an operator who sits at an image output unit. The selected or generated defined three-dimensional volume is a volume that is relevant for the determination or adaptation of the shim with regard to the image acquisition region in question, the relevant volume being matched to the examination region or an examination protocol.

The shim is calculated using the determined three-dimensional volume, which can also have been determined by a combination of a selection from existing volumes or a generation of a volume (for example by post-processing of a selected volume). For this purpose, a calculation of the underlying spherical functions of the first and second orders is implemented. This calculation is made easier by the inventive selection of an optimally adapted volume since, given an adapted volume, no larger regions with air or inhomogeneities must be accepted for the region of interest for the adaptation. After the calculation of the shim according to the box c of the flow chart, the desired magnetic resonance exposures can possibly be generated (as optionally indicated in box d). The corresponding shim measures according to the calculation result are to be implemented beforehand by active and/or passive shimming.

The generation of magnetic resonance exposures according to the box (that is drawn dashed to indicate it is optional) can already precede the selection of the 3D volume according to the box a or the generation of the 3D volume according to the box b. A first overview exposure or a pre-scan or an older exposure can thus already exist.

Such an overview exposure can possibly (likewise optionally) be replaced by anatomical data according to the box f from an atlas or an anatomical library or the like.

The anatomical data according to the box f can influence the selection of the 3D volume or the volume generation according to the boxes a and b, for example insofar as specific anatomical data that are associated with suitable volumes of a library of 3D volumes with the aid of a databank are selected from the image atlas dependent on the examination protocol that was selected by the operator. A predefined volume thus can already be specified or selected using an anatomical atlas. As a result, this volume can be further adapted by a user according to the box b such that in this sense a generation of the three-dimensional volume is effected as a post-processing.

The selection of the 3D volumes according to the box a can be supported by a library of predetermined 3D volumes according to the box g. This library contains volumes that are determined by the examination regions or examination protocols, thus in principle are not limited to specific shapes such as cuboids or the like. The volumes are in principle arbitrary, such that the library exhibits an (in this sense arbitrary) morphology set that includes appropriate ellipsoid shapes or spheres but also cylinders that, for example, are drawn particularly long for spinal column acquisitions.

A 3D volume with a suitable size and orientation and at the correct position (for example given by or entered into an anatomical image of the examination region) can be predetermined by the anatomical data in connection with the library of the predefined 3D volumes according to the boxes f and g. Not only are the library data and the anatomical data according to the boxes g and f respectively organized via a databank, but there advantageously exists for this purpose an underlying databank that enables a linking between the library volumes and the anatomical data for optimal selection of the 3D volume suitable for adaptation of the shim.

According to the invention the shim calculation is consequently no longer determined by a rigid cuboid volume, so that it is possible to simplify the calculation, to improve the calculated shim and to design the workflow before the actual image acquisition (thus in the pre-scan time frame) faster.

Figure 2:
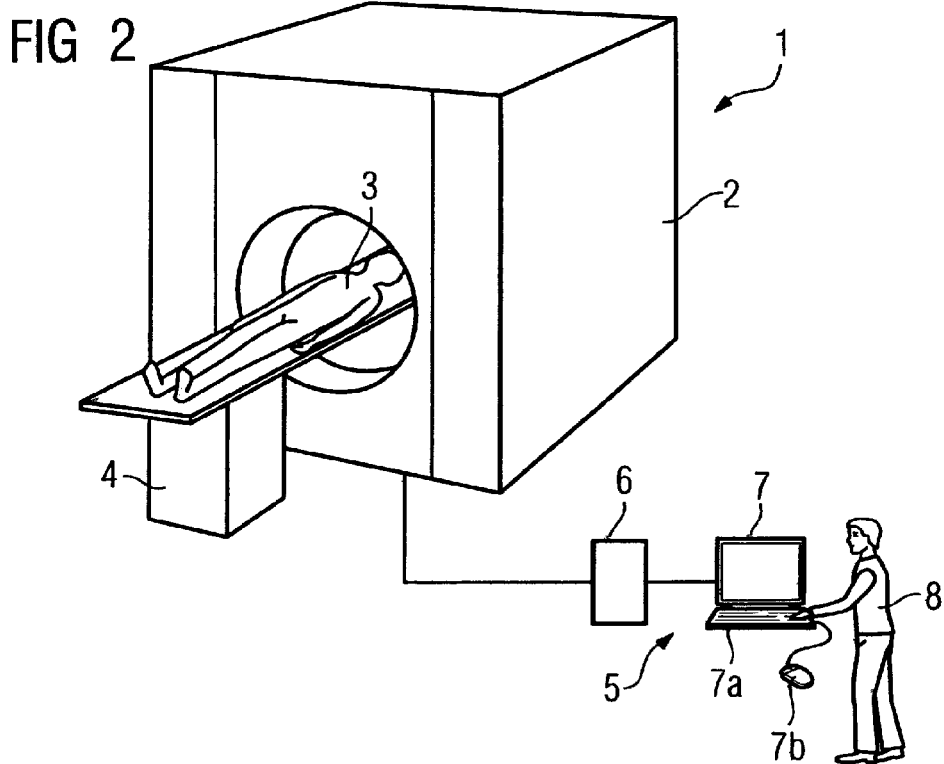
FIG. 2 schematically illustrates n inventive magnetic resonance apparatus.

FIG. 2 shows an inventive magnetic resonance apparatus 1. The magnetic resonance apparatus 1 has a magnetic resonance tomography scanner 2 into which a patient 3 on a patient bed 4 is introduced. The generation of image exposures is implemented by the magnetic resonance tomography scanner 2.

Furthermore, the magnetic resonance apparatus 1 has an operating console 5 that includes a computer 6 as well as an image output unit 7. The image output unit 7 is provided with a keyboard 7a as well as a control tool 7b in order to allow for interaction by an operator 8 by means of software that is stored in the computer that is externally accessible.

Furthermore, the computer 6 of the console 5 has access to a library of a morphology set of predefined three-dimensional volumes for a determination or adaptation of a shim for homogenization of the magnetic field of the magnetic resonance tomograph 2. Anatomical data that are linked with the library of the three-dimensional volumes via databank functionalities are likewise available for access from the console 5. The library as well as the anatomical data are stored in the computer 6 itself for access. An embodiment in which the library and/or the anatomical data are not available locally but rather externally (for example on an external server of a service provider), for access from, the console 5 is likewise conceivable.

The operator 8 (such as a technical assistant) now specifies a desired examination or an examination protocol for image data acquisition in an examination region of the patient 3 with the aid of a software interface (presented on the image output means 7) and using the keyboard 7a as well as the control tool 7b. The computer 6, which has suitable software for this purpose, thereupon automatically determines a three-dimensional region (thus a three-dimensional volume) suitable for the determination of the shim using the library as well as the anatomical data, which three-dimensional volume is displayed to the operator 8 at the image output unit 7 in the anatomical context of the respective examination protocol. The operator 8 now has the possibility to optimally adapt the shim volume in the framework of a fine adaptation via the keyboard 7a as well as the control tool 7b. Alternatively, the procedure can run wholly automatically after an initial registration of the patient.

In the present case a brain examination is to be implemented, such that an ellipsoid three-dimensional volume is suggested to the operator 8 by the computer 6 through the console 5, which three-dimensional volume can be further adapted under consideration of the specific anatomy of the patient 3 in the event that this is necessary. For this purpose, the operator 8 can make use of first scan exposures of the patient 3 or exposures and results of other examinations available through the console 5, i.e. to anatomical data in the broadest sense. Furthermore, the fine tuning of the shim volume can ensue dependent on the specific diagnostic question.

With the inventive magnetic resonance apparatus 1 it is thus possible to optimally adapt the shim volume to the examination region of the patient 3 in question for an adaptation or first determination of the shim for homogenization of magnetic field of the magnetic resonance tomography scanner 2 in order to thus achieve not only a better homogenization of the magnetic field but also a faster workflow of the preparations of the actual image acquisition with the magnetic resonance apparatus 1.

Figure 3:
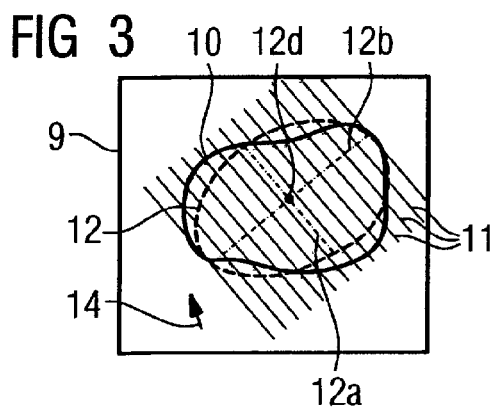
FIGS. 3 and 4 illustrate volume determination for a shim given cardiological acquisitions in accordance with the invention.
Figure 4:
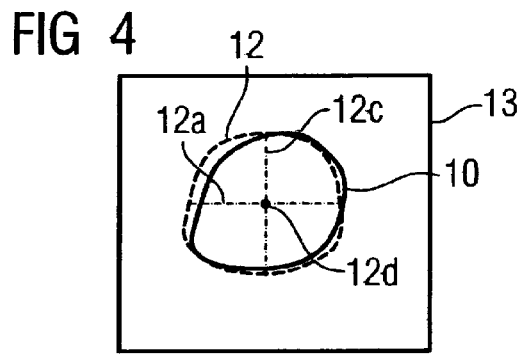

A representation for volume determination for a shim in the case of cardiological acquisitions is shown in FIGS. 3 and 4.

FIG. 3 illustrates an initial two-dimensional image representation 9 in which the heart 10 is shown. Furthermore, various slices, which are the slices of a first scan acquisition by magnetic resonance tomography, are indicated by lines 11. While it was typical in conventional methods to simply take these slice groups and to define a rectangular or cuboid volume that encloses them, which volume was then used for the shim adaptation, in the inventive method a determination of the shim adaptation volume matched to the shape of the respective examination region is possible.

For this purpose, an ellipsoid 12 that is adapted to the shape of the heart 10 with regard to its size and orientation is suggested by the computer 6, obtained from a library.

The heart 10 is shown in only two dimensions in the representation of FIG. 3. The image representation 13 of FIG. 4 likewise two-dimensionally shows a view of the heart 10 along the axis 12a of the ellipsoid and preparation to the representation of FIG. 3. Here as well the ellipsoid 12 is drawn again so that in this projection as well it is also adapted to the shape of the heart 10 with regard to its orientation and size.

Furthermore, the axes of the ellipsoid 12 designated with the reference characters 12a-12c are shown. For the determination of the basic shape of the ellipsoid 12 as well as the arrangement relative to the heart 10, the computer access a library of morphology sets of three-dimensional shapes that are linked with anatomical data. A fine tuning can be effected by an operator using, for example, a mouse arrow 14 on a screen. For example, the operator can displace the focus 12d of the ellipsoid 12 somewhat or adapt the length of the individual axes 12a-12c, possibly by entering the desired axis length into an input field (not shown here) or clicking on or dragging to shorten the length of the corresponding axes 12a-12c with the mouse arrow 14.

Figure 5:
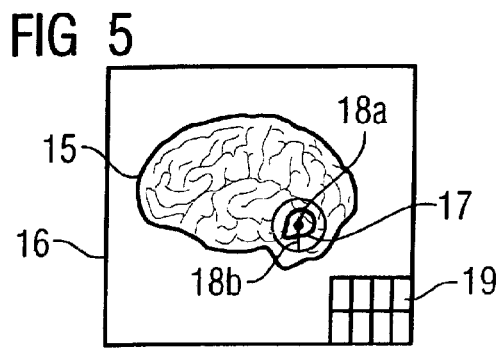
FIG. 5 illustrates volume determination for a shim for acquisitions of an image of the brain in accordance with the invention.

A three-dimensional volume determination for a shim given acquisitions of the brain 15 is shown in FIG. 5. The brain 15 that is shown in the image representation 16 of FIG. 5 is presented in a three-dimensional view, with a tumor 17 being located in the region below and to the right in the view of the brain 15. This tumor 17 is to be examined in the framework of the generation of magnetic resonance exposures.

In order to adapt the shim of the magnetic resonance tomography scanner 2 for the planned examination, a shim adaptation volume 18 (which is presently a sphere with the center point 18a as well as the radius 18b) is defined by the operator 8. This sphere is selected by the operator 8 from a menu 19 of different three-dimensional volumes provided by the computer 6 or software of the computer 6. The provision of the different volumes in the menu 19 on the part of the computer is enabled by access to a library of three-dimensional volumes that is linked with data about examination protocols as well as the underlying anatomies. From the menu 19 that was constructed according to a pre-selection implemented by the computer 6 dependent on the examination protocol, the operator 8 now selects the spherical shape that is particularly suited for the acquisition of the tumor 17, and thus establishes the shim volume.

Figure 6:
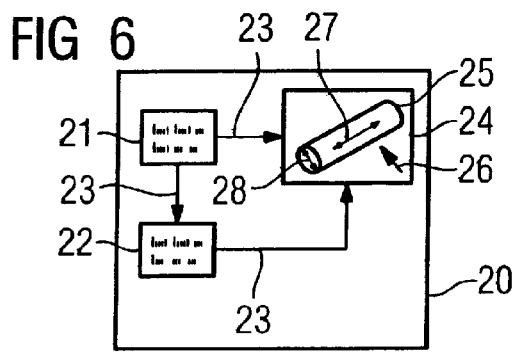
FIG. 6 illustrates volume determination dependent on an examination protocol as well as anatomical data in accordance with the invention.

A diagram of the volume determination dependent on an examination protocol as well as anatomical data is shown in FIG. 6. The image representation 20 of FIG. 6 shows an input field 21 in which a user has input a desired examination protocol for a magnetic resonance acquisition. According to the input field 21, a connection to anatomical data is now established from the examination protocol, whereby the anatomical data recognized as relevant are presented (here indicated by the menu field 22). The arrows 23 show the association between the input field 21 for the examination protocol and the menu field 22 for the anatomical data, such that a dependency exists between the examination protocol according to the input field 21 and the anatomical data according to the menu field 22. Thus not only the examination protocol but also the anatomical data are used or are linked with one another to determine the three-dimensional shim volume (which is an extended cylinder) shown in the representation 24.

Such an extended cylinder as a three-dimensional shim volume 25 is in particular suitable for spinal column acquisitions. Further volumes are offered to the operator 8 in the menu field (possibly in addition to the presentation of anatomical data) or background information regarding the anatomical data are provided that can support said user in the following image data acquisition and in the location of the correct shim volume. The three-dimensional shim volume 25 that was determined under consideration of the examination protocol according to the input field 21 as well as the anatomical data according to the menu field 22 can be further adapted by the operator 8 for final establishment of the suitable volume if this is desired. This is indicated by the mouse arrow 26, which allows a change of the length of the cylinder as well as a change of the diameter of the circular cross-section area, as is indicated here by the arrows 27 and 28. Alternatively or additionally, an adaptation of the three-dimensional shim volume 25 can ensue via keyboard inputs or the like.

In each case the shim volume can be optimally adapted to the examination region or, respectively, the examination protocol without limitations of the volume shape, in particular without a limitation to a cuboid volume, so the calculation of the shim can be improved and accelerated.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for setting a shim to homogenize a magnetic field of a magnetic resonance apparatus, said magnetic field being generated in the magnetic resonance apparatus to assist in acquiring magnetic resonance exposures of a predetermined examination region, comprising the steps of:
   in a computer, at least semi-automatically designating a three-dimensional volume that is relevant for setting a shim for acquiring magnetic resonance data from an examination region using an examination protocol, said computer at least automatically setting said three-dimensional volume matched to at least one of said examination region and said examination protocol by selecting said three-dimensional volume from a plurality of arbitrary morphology sets of selectable volumes, not limited to specific volume shapes, or by generating said three-dimensional volume as an arbitrary three-dimensional volume not limited to a specific volume shape; and
   in said computer, automatically calculating said shim for said three-dimensional volume that has been at least semi-automatically designated, and making the calculated shim available as an output from the computer in a form for implementing said shim in said magnetic resonance apparatus.

2. A method as claimed in claim 1 wherein said computer wholly automatically designates said three-dimensional volume.

3. A method as claimed in claim 1 comprising semi-automatically setting said three-dimensional volume in said computer with interaction, via an interface to said computer, by an operator.

4. A method as claimed in claim 3 comprising, in said computer, wholly automatically setting said three-dimensional volume by selecting a predetermined volume, that is predetermined dependent on said at least one of said examination region and said examination protocol and displaying said predetermined volume to the operator via said computer interface, and allowing modification of said predetermined volume by interaction of said operator via said computer interface.

5. A method as claimed in claim 4 comprising allowing modification of said predetermined volume via said interface by modification selected from the group consisting of graphical modifications and text-based modifications.

6. A method as claimed in claim 5 wherein said computer comprises a manually manipulable control tool and comprising making said modifications to said predetermined three-dimensional volume by altering said predetermined three-dimensional volume with said control tool interacting with said display.

7. A method as claimed in claim 5 wherein said predetermined three-dimensional volume on said display is comprised of display input fields, and comprising modifying said predetermined three-dimensional volume by changing at least one of said input fields.

8. A method as claimed in claim 1 comprising, in said computer, at least semi-automatically setting said three-dimensional volume by first formulating a two-dimensional constituent of said three-dimensional volume and completing said three-dimensional volume in a third spatial direction independent of the two-dimensional configuration.

9. A method as claimed in claim 1 comprising storing said morphology sets of selectable volumes as a library of a plurality of pre-defined volumes, accessible by said computer.

10. A method as claimed in claim 9 comprising, in said computer, automatically selecting one of said pre-defined volumes, as a default volume, dependent on said at least one of said examination region and said examination protocol.

11. A method as claimed in claim 1 comprising, from said computer, accessing stored anatomical data and using the accessed, stored anatomical data, in addition to said at least one of said examination region and said examination protocol, to at least semi-automatically set said three-dimensional volume.

12. A method as claimed in claim 11 comprising using the accessed, stored anatomical data in the computer to determine anatomical information associated with said three-dimensional volume.

13. A method as claimed in claim 11 comprising using said accessed, stored anatomical data in said computer to determine an appropriate spatial position of said three-dimensional volume.

14. A method as claimed in claim 11 comprising using said accessed, stored anatomical data in setting said three-dimensional volume by executing an algorithm embodying said anatomical data selected from the group consisting of image analysis algorithms, pattern recognition algorithms, and segmentation algorithms.

15. A method as claimed in claim 1 comprising visually presenting said three-dimensional volume at a display in communication with said computer.

16. A method as claimed in claim 15 comprising allowing modification of a spatial position of the displayed three-dimensional volume by manual interaction with the displayed three-dimensional volume at said display.

17. A method as claimed in claim 1 comprising providing, in said morphology set, a plurality of three-dimensional volumes including a sphere, a cylinder, and an ellipsoid.

18. A magnetic resonance apparatus comprising:
a basic field magnet that generates a basic magnetic field to assist in acquiring magnetic resonance exposures of a predetermined examination;
a shim arrangement that homogenizes said basic magnetic field;
a computer that at least semi-automatically designates a three-dimensional volume that is relevant for setting said shim arrangement for acquiring magnetic resonance data from the examination region using an examination protocol, said computer at least automatically setting said three-dimensional volume matched to at least one of said examination region and said examination protocol by selecting said three-dimensional volume from a plurality of arbitrary morphology sets of selectable volumes, not limited to specific volume shapes, or by generating said three-dimensional volume as an arbitrary three-dimensional volume not limited to a specific volume shape; and
said computer automatically calculating values for setting said shim arrangement for said three-dimensional volume that has been at least semi-automatically designated, and making the calculated values available as an output from the computer in a form for setting said shim arrangement in said magnetic resonance apparatus.

19. A magnetic resonance apparatus as claimed in claim 18 comprising an image display connected to said computer and a user interface interacting with said computer and said display, and wherein said computer causes said three-dimensional volume to be displayed at said display and wherein said user interface allows manual modification of the three-dimensional volume at said display.

* * * * *